United States Patent
Mulders

(10) Patent No.: US 11,602,022 B2
(45) Date of Patent: Mar. 7, 2023

(54) ISOLATED VOLTAGE DETECTION WITH CURRENT LIMITERS

(71) Applicant: Koninklijke Fabriek Inventum B.V., Nieuwegein (NL)

(72) Inventor: Dennis Mulders, Etten-Leur (NL)

(73) Assignee: B/E AEROSPACE, INC., Winston Salem, NC (US)

( * ) Notice: Subject to any disclaimer, the term of this patent is extended or adjusted under 35 U.S.C. 154(b) by 10 days.

(21) Appl. No.: 17/132,961

(22) Filed: Dec. 23, 2020

(65) Prior Publication Data

US 2022/0201815 A1    Jun. 23, 2022

(51) Int. Cl.
| | | |
|---|---|---|
| *H05B 45/12* | (2020.01) | |
| *H05B 45/14* | (2020.01) | |
| *H05B 45/345* | (2020.01) | |
| *H05B 47/25* | (2020.01) | |
| *G05F 1/573* | (2006.01) | |

(Continued)

(52) U.S. Cl.
CPC ............ *H05B 45/12* (2020.01); *G05F 1/573* (2013.01); *H05B 45/14* (2020.01); *H05B 45/345* (2020.01); *H05B 47/25* (2020.01); *G05F 1/565* (2013.01); *G05F 1/569* (2013.01); *H05B 6/1236* (2013.01); *H05B 41/2851* (2013.01)

(58) Field of Classification Search
CPC ...... H05B 45/12; H05B 45/14; H05B 45/345; H05B 47/25; H05B 6/1236; H05B 41/2851; G05F 1/573; G05F 1/565; G05F 1/569
See application file for complete search history.

(56) References Cited

U.S. PATENT DOCUMENTS

| | | |
|---|---|---|
| 7,098,555 B2 | 8/2006 | Glahn et al. |
| 8,102,080 B2 * | 1/2012 | Fonseca ............... H05B 1/0263 |
| | | 307/130 |

(Continued)

FOREIGN PATENT DOCUMENTS

| | | |
|---|---|---|
| CA | 2817498 A1 | 12/2013 |
| CN | 104600707 A | 5/2015 |

(Continued)

OTHER PUBLICATIONS

Reddit ("https://www.reddit.com/r/diytubes/comments/h7x0cf/came_up_with_this_current_limiting_circuit_anyone/"; publicly available online: Jun. 12, 2020). (Year: 2020).*

(Continued)

*Primary Examiner* — Wei (Victor) Y Chan

(74) *Attorney, Agent, or Firm* — Locke Lord LLP; Joshua Jones; Scott Wofsy

(57) ABSTRACT

A circuit comprises an optical coupling including an illuminator optically coupled to an optical sensor to output a voltage from the optical sensor based on intensity of illumination from the illuminator. The circuit includes a voltage input node with a resistance connected in series between the voltage input and a Zener diode. A method includes powering an illuminator with current from a first voltage input node. The method includes sensing illumination level in illumination from the illuminator with a sensor and outputting output proportionate to illumination sensed by the sensor indicative of voltage detected at the voltage input node. The method can include limiting current between the voltage input node and the illuminator.

12 Claims, 3 Drawing Sheets

(51) Int. Cl.
*G05F 1/565* (2006.01)
*G05F 1/569* (2006.01)
*H05B 6/12* (2006.01)
*H05B 41/285* (2006.01)

(56) References Cited

U.S. PATENT DOCUMENTS

| | | | |
|---|---|---|---|
| 8,576,530 B2 | 11/2013 | Aronson et al. | |
| 8,729,807 B2* | 5/2014 | Fu | H05B 47/25 315/122 |
| 8,841,860 B2* | 9/2014 | Gilliom | H02M 3/158 315/297 |
| 9,179,521 B2* | 11/2015 | Bockle | H05B 47/10 |
| 9,521,730 B2* | 12/2016 | Rezeanu | H04L 25/0266 |
| 9,771,154 B2 | 9/2017 | Hess | |
| 10,384,802 B2 | 8/2019 | Ferrer et al. | |
| 11,160,155 B2* | 10/2021 | Westrick, Jr. | H05B 47/19 |
| 2002/0036581 A1* | 3/2002 | Haeusser-Boehm | H05B 39/045 341/157 |
| 2013/0334201 A1 | 12/2013 | Nicholson | |
| 2016/0336938 A1 | 11/2016 | Jeep et al. | |
| 2019/0237964 A1* | 8/2019 | Bandel | H02H 3/00 |

FOREIGN PATENT DOCUMENTS

| | | |
|---|---|---|
| CN | 106787655 A | 5/2017 |
| CN | 106787656 A | 5/2017 |
| CN | 206481047 U | 9/2017 |
| DE | 102016203419 A1 | 9/2017 |
| FR | 3085153 A1 | 2/2020 |
| GB | 2030765 A | 4/1980 |
| WO | 2008063271 A1 | 5/2008 |

OTHER PUBLICATIONS

StackExchange.com ("https://electronics.stackexchange.com/questions/473607/resistor-parallel-to-optocoupler-led-in-zener-stabilized-circuit"; publicly available date: Dec. 29, 2019) (Year: 2019).* edaboard.com ("https://www.edaboard.com/threads/query-on-optocoupler-with-diode-in-series.291411/"; publicly available date: Jul. 17, 2013) (Year: 2013).*

Extended European Search Report dated May 11, 2022, issued during the prosecution of European Patent Application No. EP 21217063.3.

* cited by examiner

ISOLATED VOLTAGE DETECTION WITH CURRENT LIMITERS

BACKGROUND

1. Field

The present disclosure relates to voltage detection, and more particularly to voltage detection such as used in ovens aboard aircraft.

2. Description of Related Art

A voltage detection circuit is used to determine if an input voltage is above a certain level where the device (e.g. aircraft galley oven) will function properly. Traditional voltage detection circuits for this application have been built around an optical coupler to provide galvanic insulation. Generally, these circuits contain a Zener diode that defines a minimum voltage threshold to which the circuit has to respond. Once the threshold is reached resistors are intended to limit the current. A non-Zener diode is used to block reverse currents, resulting in the circuit only responding to half the sine wave. But in conventional circuits power can increase exponentially with input voltage resulting in runaway currents.

The conventional techniques have been considered satisfactory for their intended purpose. However, there is an ever present need for improved systems and methods for isolated voltage detection with improved voltage tolerance. This disclosure provides a solution for this need.

SUMMARY

A circuit comprises an optical coupling including an illuminator optically coupled to an optical sensor to output a voltage from the optical sensor based on intensity of illumination from the illuminator. The circuit includes a voltage input node with a resistance connected in series between the voltage input and a Zener diode. The Zener diode is oriented to block current from the voltage input node through the resistance below a threshold voltage, and to allow current from the voltage input node through the resistance above the threshold voltage. The Zener diode is operatively connected to the illuminator to power the illuminator. The circuit further comprises a current limiter connected between the voltage input node and the Zener diode to provide consistent current to the illuminator above the threshold voltage.

The current limiter can include a switching component with a drain connected to the voltage input node. The current limiter can include a source connected to a first node in series between the Zener diode and the resistance and a gate connected to a second node in series between the resistance and the first node. The switching device can be a MOSFET. The source of the switching device can connect to the first node through a source resistor. The resistance can include two resistors connected in series with one another.

The Zener diode can be a first Zener diode and the circuit can include a second Zener diode in series between the first and second node. The second Zener diode can be oriented in the same direction with respect to the voltage input node as is the first Zener diode. The circuit can include a third Zener diode in series between the second first node and the first Zener diode. The third Zener diode can be oriented in the same direction with respect to the voltage input node as are the first and second Zener diodes. The circuit can include a diode in series between the Zener diode and the illuminator, wherein the diode is oriented opposite the orientation of the Zener diode.

The voltage input node can be a first voltage input node configured to provide voltage from a first phase of an electrical heated oven. The voltage input node can include a second input node configured to provide voltage from a second phase of the electrical heated oven.

The illuminator can be a light emitting diode (LED) connected in series between the first voltage input node and the second voltage input node. The LED can be oriented to allow current flow from the first voltage input node to the second voltage input node. The circuit can include a parallel diode connected to the first and second voltage input nodes in parallel with the LED but with opposite orientation.

A method includes powering an illuminator with current from a first voltage input node. The method includes sensing illumination level in illumination from the illuminator with a sensor and outputting output proportionate to illumination sensed by the sensor indicative of voltage detected at the voltage input node. The method can include limiting current between the voltage input node and the illuminator.

In the method, powering the illuminator and outputting can be performed while maintaining galvanic insulation between the illuminator and the sensor. Limiting current can include using a switching component with a drain connected to the voltage input node, a source connected to a first node in series between a Zener diode and a resistance, and a gate connected to a second node in series between the resistance and the first node. The illuminator can include powering a light emitting diode (LED) connected between the voltage input node connected to a first phase heating element and a second voltage input node connected to a second phase heating element.

These and other features of the systems and methods of the subject disclosure will become more readily apparent to those skilled in the art from the following detailed description of the embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE EMBODIMENTS

Figure 1:
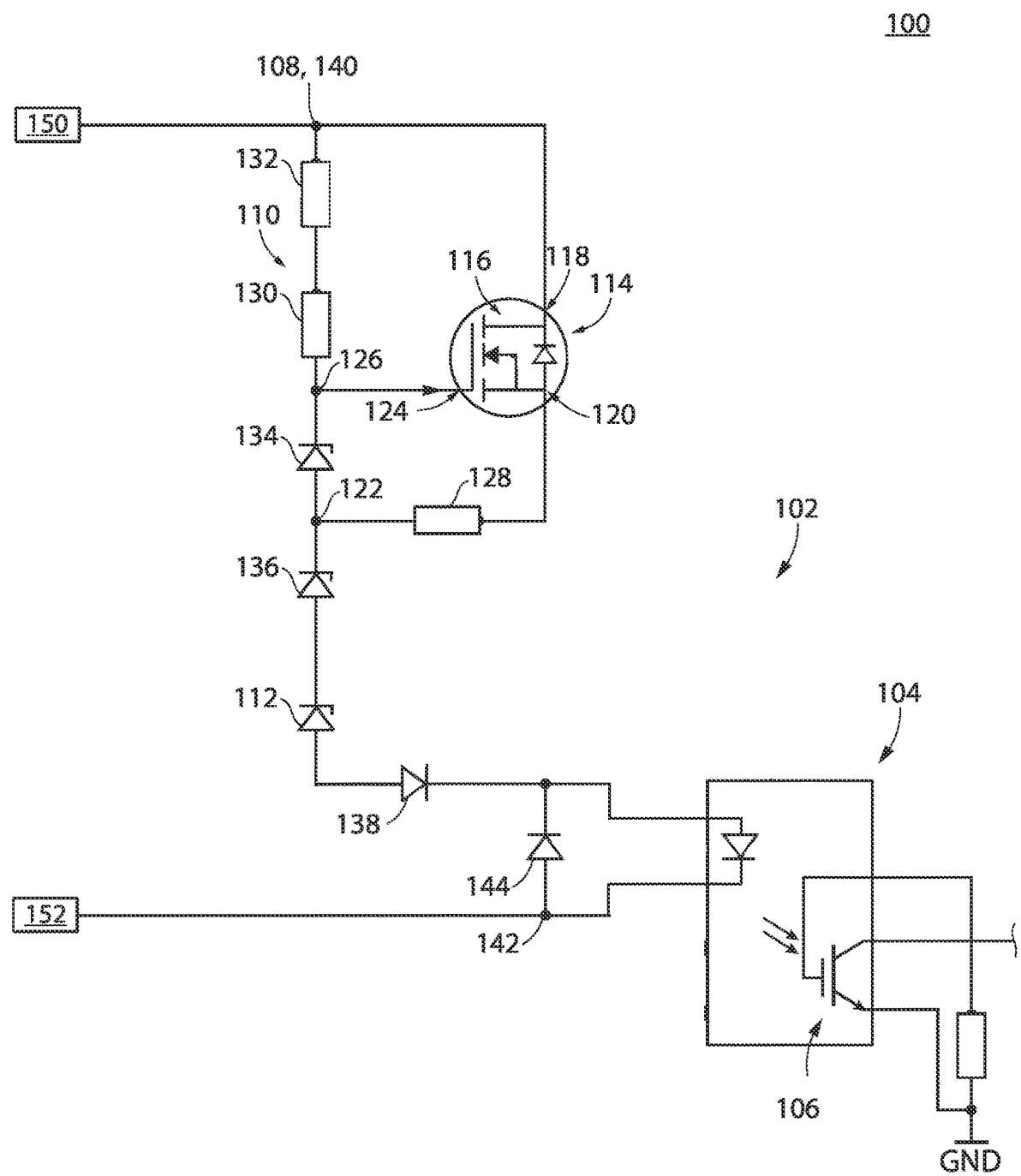
FIG. 1 is a schematic circuit diagram of an embodiment of a circuit in accordance with the present disclosure, showing an isolated voltage detection circuit.

Reference will now be made to the drawings wherein like reference numerals identify similar structural features or aspects of the subject disclosure. For purposes of explanation and illustration, and not limitation, a schematic diagram of an embodiment of a circuit in accordance with the disclosure is shown in FIG. 1 and is designated generally by reference character 100.

Other embodiments of systems in accordance with the disclosure, or aspects thereof, are provided in FIGS. 2-3, as will be described. The systems and methods described herein can be used in a system to tolerate higher input voltages without experiencing runaway currents (for example as illustrated in FIG. 3).

Referring to FIG. 1, a circuit 100 can comprise an optical coupling 102, including an illuminator 104 optically coupled to an optical sensor 106. The optical coupling 102 can be configured to output a voltage from the optical sensor 106 based on intensity of illumination from the illuminator 104. The circuit 100 can include a voltage input node 108, a Zener diode 134, and a resistance 110, where the resistance 110 can be connected in series between the voltage input node 108 and the Zener diode 134. It is contemplated that the resistance 110 can include two resistors (e.g. 130, 132) connected in series with one another, for example as shown in FIG. 1, however, any suitable number of resistors can be used.

In embodiments, the Zener diode 134 can be oriented in the circuit 100 to block current from the voltage input node 108 through the resistance 110 below a threshold voltage and oriented to allow current from the voltage input node 108 through the resistance 110 above the threshold voltage. The Zener diode 134 can be operatively connected to the illuminator 104 to power the illuminator 104 with voltage from the voltage input node 108. In embodiments, the circuit 100 can further include a current limiter 114 connected between the voltage input node 108 and the Zener diode 134 to provide consistent current to the illuminator 104 above the threshold voltage. While the circuit shows multiple Zener diodes 112 and 136 it should be appreciated by those skilled in the art, that Zener diodes 112,136 can form the same Zener diode, for example, the circuit can include only two Zener diodes 112/136 and 134. By splitting the diodes 112,136, it is possible to reduce the max power of each diode and/or to select differing thresholds. Therefore, Zener diodes 112,136 will be hereafter referred to as a single component 112/136.

The current limiter 114 can include a switching component 116. The switching component can include a drain 118 connected to the voltage input node 108, and a source 120 connected to a first node 122 in series between the Zener diode 112/136 and the resistance 110. The switching component can also include a gate 124 connected to a second node 126 in series between the resistance 110 and the first node 122. In embodiments, the switching component 116 can be a MOSFET, e.g. as shown in FIG. 1, however any suitable switching component can be included. The source 120 of the switching component 116 can connect to the first node 122 through a source resistor 128.

In embodiments, the Zener diode 112/136 can be a first Zener diode 112/136 and the circuit 100 can include a second Zener diode 134 in series between the first and second nodes 122 and 126. It is contemplated that the second Zener diode 134 can be oriented in the same direction with respect to the voltage input node 108 as is the first Zener diode 112/136. Further, the circuit 100 can include a non-Zener diode 138 in series between the Zener diode 112 and the illuminator 104, wherein the diode 138 is oriented opposite the orientation of the Zener diode 112/136.

As shown in FIG. 1, the voltage input node 108 can be a first voltage input node 140 configured to provide voltage from a first phase of an electrical heated oven 150. In embodiments, the circuit 100 can also include a second input node 142 configured to provide voltage from a second phase of the electrical heated oven 152. For the sake of clarity, ovens 150 and 152 are shown schematically in FIG. 1 connected to voltage input nodes 140 and 142 respectively.

In embodiments, the illuminator 104 can be a light emitting diode (LED)(e.g. as shown schematically in FIG. 1), however, any suitable illuminator can be used. The LED 104 can be connected in series between the first voltage input node 108 and the second voltage input node 142. The LED 104 can be oriented to allow current flow from the first voltage input node 108 to the second voltage input node 142. In further embodiments, the circuit 100 can include a parallel diode 144 connected to the first and second voltage input nodes 140, 142 in parallel with the LED 104 but with opposite orientation.

Figure 2:
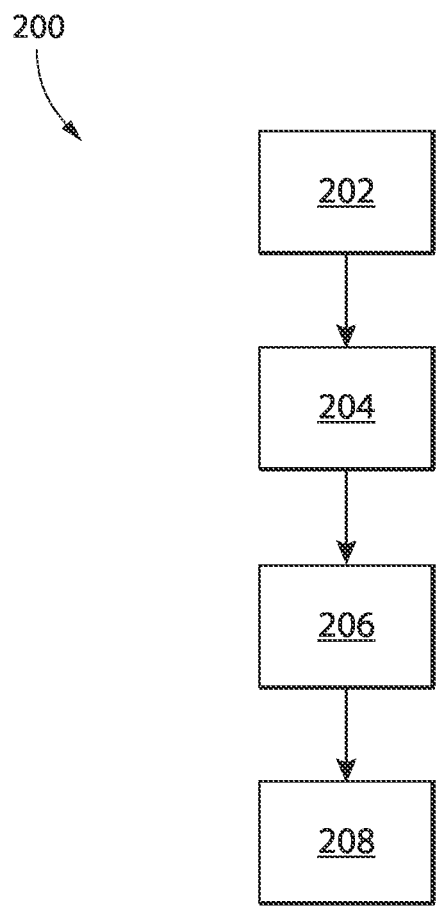
FIG. 2 is a schematic diagram of a method for detecting voltage in a circuit.
Figure 3:
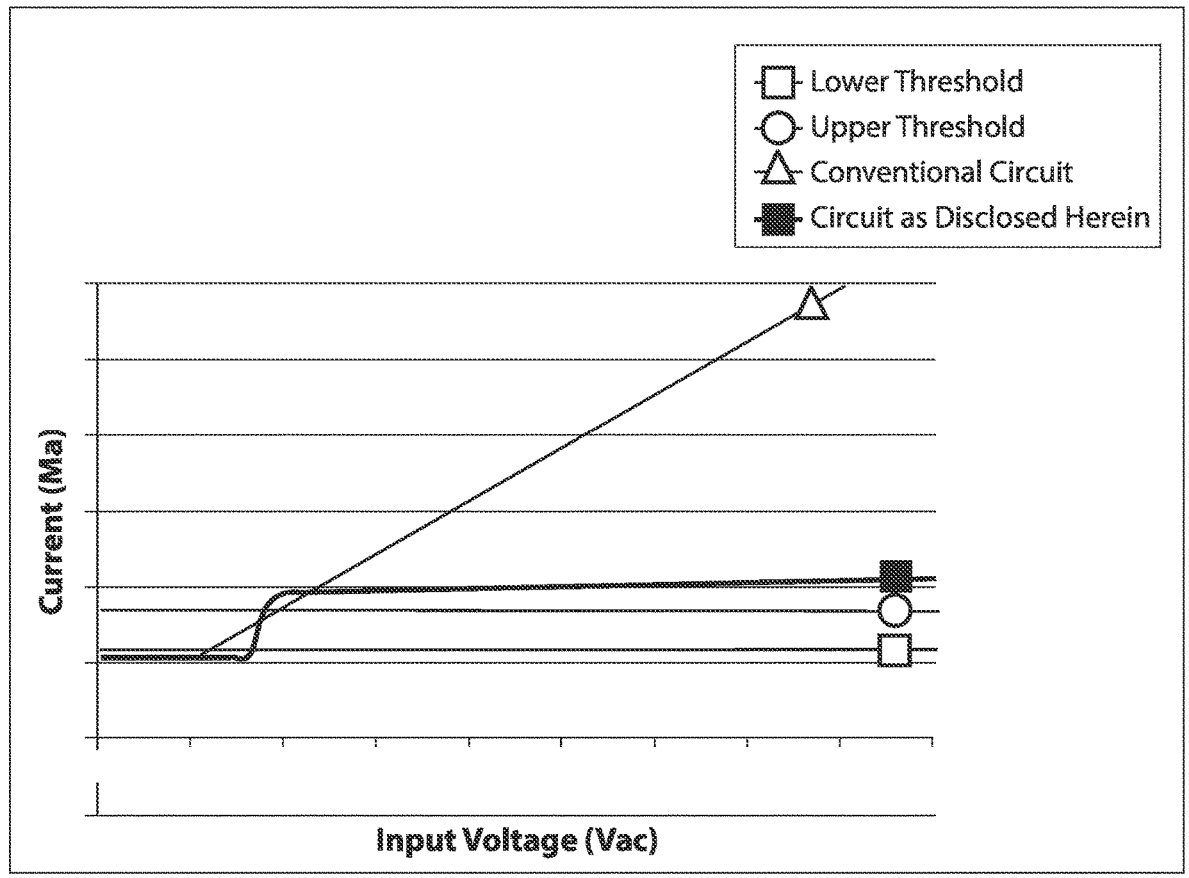
FIG. 3 is a graphical view showing the current limiting effects of the system of FIG. 1.

Referring now to FIG. 2, a method 200 includes, at box 202, limiting current between a voltage input node 108 and an illuminator 104. At box 204, the method 200 can include powering the illuminator 104 with current from a first voltage input node 108,140,142. The method 200 can include sensing illumination level in illumination from the illuminator 104 with a sensor (e.g. optical sensor 106), as shown at box 206. In embodiments, the method 200 can include, as shown in box 208, outputting output proportionate to illumination sensed by the sensor 106 indicative of voltage detected at the voltage input node 108,140,142.

In the method 200, powering the illuminator 104 (e.g. box 202) and outputting (e.g. box 204) can be performed while maintaining galvanic insulation between the illuminator 104 and the sensor 106. Limiting current (e.g. box 208) can include using a switching component 116 with a drain 118 connected to the voltage input node 108, a source 120 connected to a first node 122 in series between a Zener diode 112/136 and a resistance 110, and a gate 124 connected to a second node 126 in series between the resistance 110 and the first node 122. Powering the illuminator 104 (e.g. as in box 202) can include powering a light emitting diode (LED) connected between the voltage input node 108 connected to a first phase heating element (e.g. oven 150) and a second voltage input node 142 connected to a second phase heating element (e.g. oven 152).

Turning to FIG. 3, a circuit as shown in FIG. 1 can tolerate higher input voltages without experiencing runaway currents than in traditional techniques. For example, conventional circuits (conventional circuit not shown) included a neutral line for 3-phase power, without a current limiter. In that case, the current increases rapidly when the supply voltage increases (e.g. due to the removal of the neutral line). As a result the circuit can be highly influenced by the large tolerance and non-linearity of the optocoupler current transfer ratio. Further, without a current limiter as in the conventional circuit, power will increase exponentially with input voltage thus resulting in large power consumption in the series resistors and Zener diode. The circuit as shown in FIG. 1 having a current limiter therefore allows for better precision in voltage detection and assures a consistent current through the circuit at any voltage above the threshold.

More particularly, FIG. 3 shows graphically the current running through the circuit at any point in voltage. The upper threshold can be the current required to be certain that the voltage output provided by the circuit in FIG. 1 (e.g. optical sensor 106) is detectable, while taking into account the worst case situation (e.g. production tolerances (lowest LED efficiency, lowest sensitivity optical sensor), worst case temperature, and degradation due to aging. The lower threshold refers to a system where each component is in optimal condition (e.g., highest LED efficiency, highest sensitivity optical sensor), best case temperature, and no degradation due to aging. The threshold can be considered the tolerance due to the optical coupler.

The methods and systems of the present disclosure, as described above and shown in the drawings, provide for increased precision in voltage detection and increased voltage tolerance. While the apparatus and methods of the subject disclosure have been shown and described with reference to embodiments, those skilled in the art will readily appreciate that changes and/or modifications may be made thereto without departing from the scope of the subject disclosure.

What is claimed is:

1. A circuit comprising:
    an optical coupling including an illuminator optically coupled to an optical sensor to output a voltage from the optical sensor based on intensity of illumination from the illuminator;
    a voltage input node with a resistance connected in series between the voltage input and a Zener diode oriented to block current from the voltage input node through the resistance below a threshold voltage, and to allow current from the voltage input node through the resistance above the threshold voltage, wherein the Zener diode is operatively connected to the illuminator to power the illuminator; and
    a current limiter connected between the voltage input node and the Zener diode to provide consistent current to the illuminator above the threshold voltage, wherein the current limiter includes a switching component with a drain connected to the voltage input node, a source connected to a first node in series between the Zener diode and the resistance, and a gate connected to a second node in series between the resistance and the first node, wherein the Zener diode is a first Zener diode and further comprising a second Zener diode in series between the first and second nodes, wherein the second Zener diode is oriented in the same direction with respect to the voltage input node as is the first Zener diode.

2. The circuit as recited in claim 1, wherein the switching component is a MOSFET.

3. The circuit as recited in claim 1, wherein the source of the switching component connects to the first node through a source resistor.

4. The circuit as recited in claim 1, further comprising a third Zener diode in series between the second node and the first Zener diode, wherein the third Zener diode is oriented in the same direction with respect to the voltage input node as are the first and second Zener diodes.

5. The circuit as recited in claim 1, further comprising a diode in series between the Zener diode and the illuminator, wherein the diode is oriented opposite the orientation of the Zener diode.

6. The circuit as recited in claim 1, wherein the voltage input node is a first voltage input node configured to provide voltage from a first phase of an electrical heated oven, and further comprising a second input node configured to provide voltage from a second phase of the electrical heated oven.

7. The circuit as recited in claim 6, wherein the illuminator is a light emitting diode (LED) connected in series between the first voltage input node and the second voltage input node, wherein the LED is oriented to allow current flow from the first voltage input node to the second voltage input node.

8. The circuit as recited in claim 7, further comprising a parallel diode connected to the first and second voltage input nodes in parallel with the LED but with opposite orientation.

9. The circuit as recited in claim 1, wherein in the resistance includes two resistors connected in series with one another.

10. A method of voltage detection in an aircraft oven comprising:
    powering an illuminator with current from a first voltage input node;
    sensing illumination level in illumination from the illuminator with a sensor and outputting output proportionate to illumination sensed by the sensor indicative of voltage detected at the voltage input node, wherein powering the illuminator includes limiting current between the voltage input node and the illuminator, wherein limiting current includes using a switching component with a drain connected to the voltage input node, a source connected to a first node in series between a Zener diode and a resistance, and a gate connected to a second node in series between the resistance and the first node, wherein the Zener diode is a first Zener diode and further comprising a second Zener diode in series between the first and second nodes, wherein the second Zener diode is oriented in the same direction with respect to the voltage input node as is the first Zener diode.

11. The method as recited in claim 10, wherein powering the illuminator and outputting are performed while maintaining galvanic insulation between the illuminator and the sensor.

12. The method as recited in claim 10, wherein powering the illuminator includes powering a light emitting diode (LED) connected between the voltage input node connected to a first phase heating element and a second voltage input node connected to a second phase heating element.

* * * * *